United States Patent [19]

Iwabuchi et al.

[11] Patent Number: 5,016,567
[45] Date of Patent: May 21, 1991

[54] APPARATUS FOR TREATMENT USING GAS

[75] Inventors: Katsuhiko Iwabuchi; Osamu Yokokawa, both of Sagamihara; Eiichiro Takanabe, Shiroyama, all of Japan

[73] Assignee: Tel Sagami Limited, Kanagawa, Japan

[21] Appl. No.: 394,929

[22] Filed: Aug. 17, 1989

[30] Foreign Application Priority Data

Aug. 26, 1988 [JP] Japan .................. 63-211770
Sep. 22, 1988 [JP] Japan .................. 63-237948

[51] Int. Cl.⁵ ............................. C23C 16/00
[52] U.S. Cl. .................... 118/733; 118/715; 118/719; 118/730; 156/345
[58] Field of Search .......... 118/715, 719, 730, 733; 156/345, 646; 204/298.02, 298.07, 298.31, 298.33

[56] References Cited

FOREIGN PATENT DOCUMENTS

| 59-78526 | 5/1984 | Japan | 118/715 |
| 62-14223 | 4/1987 | Japan | . |
| 62-235729 | 10/1987 | Japan | 118/730 |
| 62-245623 | 10/1987 | Japan | 118/715 |
| 62-245624 | 10/1987 | Japan | 118/715 |
| 62-281320 | 12/1987 | Japan | 118/715 |

Primary Examiner—Norman Morgenstern
Assistant Examiner—Terry J. Owens
Attorney, Agent, or Firm—Oblon, Spivak, McClelland, Maier & Neustadt

[57] ABSTRACT

A heat treatment apparatus used in the manufacturing of semiconductor devices and the like, for treating with a reaction gas substrates placed in a reaction tube of the apparatus. A support table is provided within the reaction tube, for supporting substrates during a treatment process, and is rotated during each treatment by a motor, via a shaft penetrating the reaction tube. That portion of the reaction tube which is penetrated by the shaft is provided with a journal bearing and a magnetic fluid seal member. The seal member is surrounded by an enclosing space which substantially separates the seal member from the reaction space within the reaction tube, the enclosing space and the reaction space communicating with each other via a narrow passage. During a heat treatment, a shield gas is supplied into the enclosing space, the pressure within the enclosing space being maintained at a higher level than that within the reaction space. As a result, the reaction gas and a gas produced during heat treatment cannot come into contact with the seal member, and thus cannot adversely affect the seal member.

7 Claims, 3 Drawing Sheets

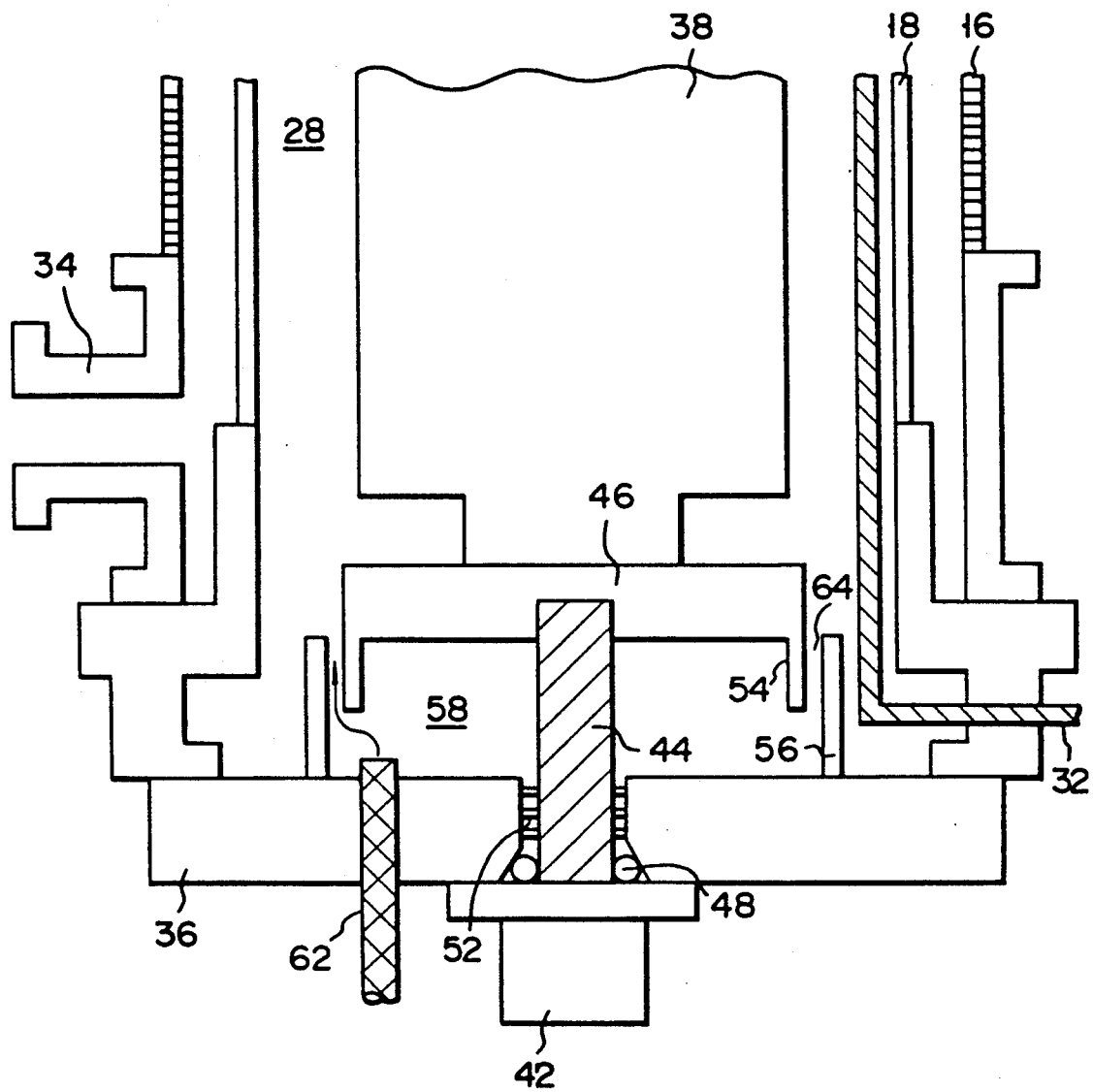
F I G. 1

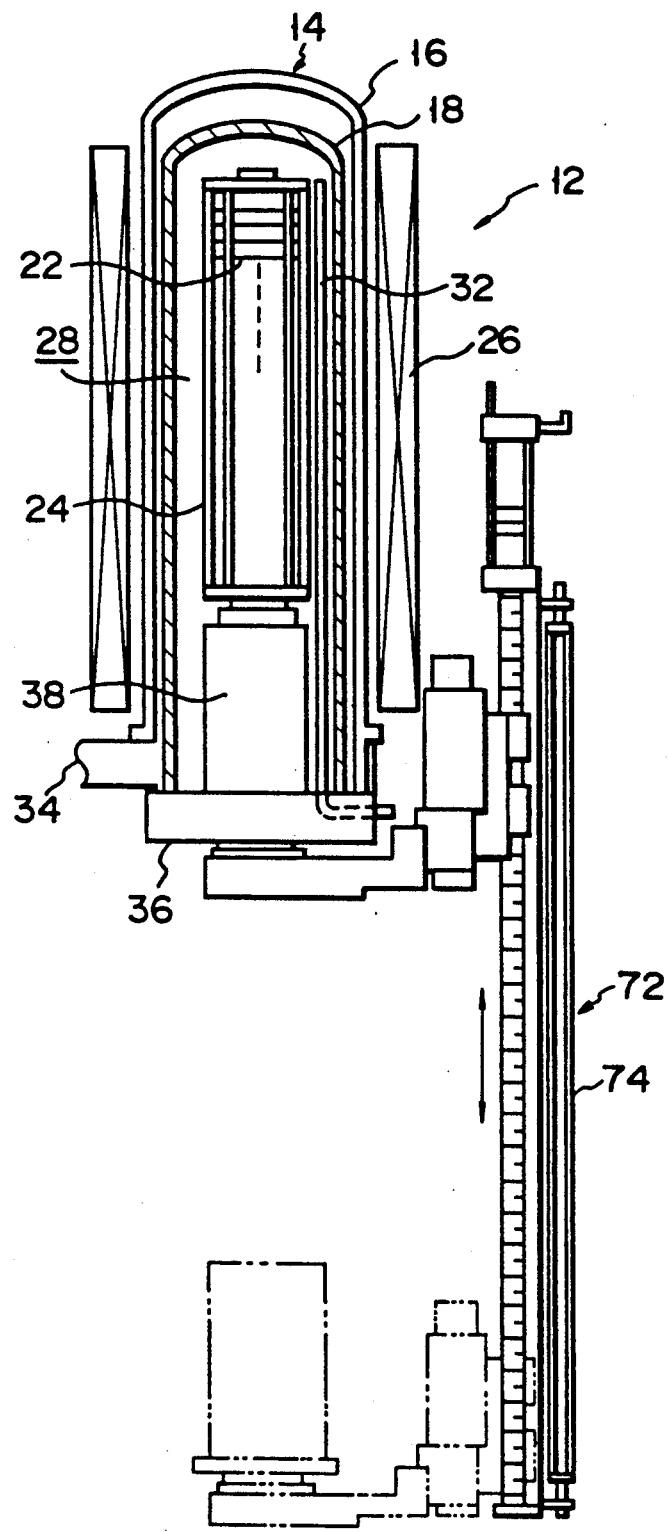
F I G. 2

APPARATUS FOR TREATMENT USING GAS

BACKGROUND OF THE INVENTION

1. Field of the Invention

The present invention relates to a treatment apparatus using a gas, such as a reaction treatment apparatus used in the manufacturing of semiconductor devices and liquid crystal drive circuit substrates, for treating an object such as a wafer substrate with a reaction gas and, more particularly, to a shield mechanism for the protection of a portion of the apparatus which is otherwise liable to be corroded (hereinafter called "corrodible portion") in an atmosphere contained in a treatment space of this type of apparatus.

2. Description of the Related Art

Processes for manufacturing semiconductor devices and liquid crystal drive circuit substrates generally employ a heat treatment apparatus which supplies a reaction gas to a heating reaction tube in order to carry out thin-film forming, impurity diffusion, oxidation, etching, and the like.

The above heat treatment apparatus typically comprises a treatment space, a heating tube surrounding the treatment space, a heating coil wound around the heating tube, and a heat-insulating layer wrapped around the heating coil. The treatment space is generally a hollow cylinder made of quartz and having an opening at one end, and the heating tube is made of silicon carbide or the like. In operation, a wafer boat containing a plurality of semiconductor wafers is inserted into the treatment space, through the opening, and then a predetermined reaction gas such as $SiH_4$, $O_2$, $B_2H_6$, or $PH_3$ is introduced into the treatment space. In advance of this, an electrical current is supplied to the heating coil, whereby the coil heats the heating tube, which in turn heats the treatment space uniformly to a predetermined temperature ranging from several hundred degrees centigrade to one thousand and several hundred degrees centigrade. As a result, the semiconductor wafers are heat-treated, and either a film is formed on the wafers or an impurity is diffused thereinto.

Heat-treatment apparatuses of this type are classified into vertical-type and horizontal-type apparatuses. Since the vertical-type heat-treatment apparatus occupies less floor space than the horizontal-type apparatus, it is therefore more popular.

Published Examined Japanese Patent Application No. 62-14223 discloses a vertical heat-treatment apparatus in which the reaction tube contains a table for supporting a wafer coat, a loading/unloading mechanism for mounting the boat on the table and demounting it from the table, and a rotary mechanism for rotating the boat, mounted on the table, about the vertical axis. The loading/unloading mechanism and the rotary mechanism are both interlocked with the table. A shaft is connected at one end to the motor of the rotary mechanism, and at its other end extends into the reaction tube, through a hole formed therein, and is connected to the wafer boat. Although the reaction tube is penetrated by the shaft, the tube is hermetically sealed by a seal member fitted in the hole and containing a magnetic fluid and having a bearing for supporting the shaft.

However, use of the seal member gives rise to the following problem: To epitaxially grow a silicon layer on the wafers, silane tetrachloride ($SiCl_4$), trichlorosilane ($SiHC_3$), or the like is made to react with hydrogen ($H_2$). During this reaction, hydrogen chloride (HCl) is produced, and reacts with the magnetic fluid contained in the seal member, generating a gas which hinders the desired reaction taking place on the wafers. Moreover, not only does the hydrogen chloride corrode the seal member, but also the bearing, jeopardizing the hermetic seal of the reaction tube and the smooth rotation of the shaft. Consequently, the production yield achieved by the vertical heat-treatment apparatus is relatively low.

SUMMARY OF THE INVENTION

It is therefore an object of the present invention to provide an apparatus and a method the use of which can minimize the adverse influence of a treatment gas on corrodible portions contained in a treatment space within the apparatus, into which the gas is introduced.

In order to achieve the above object of the present invention, there is provided a treatment apparatus for supplying a treatment gas into a treatment space containing an object to be treated, comprising means defining the treatment space, a corrodible portion forming part of the treatment apparatus and contained therein, and susceptible to corrosion in an atmosphere within the treatment space, means for enclosing the corrodible portion contained in the treatment space, and means for supplying a noncorrosive shield gas to the enclosing space, wherein the enclosing space has a higher positive pressure than the treatment space upon supply of the shield gas during a treatment.

With the above arrangement, the treatment gas and a gas produced during a treatment ar not brought into contact with the corrodible portion and therefore do not adversely affect the corrodible portion.

The treatment space forming means comprises, e.g., a reaction tube and a lid for opening/closing the reaction tube. The corrodible portion may be a magnetic fluid seal member for allowing a rotating shaft to extend through the lid. A gas pipe for the shield gas supply means may be divided into a primary pipe on the reaction tube side and a secondary pipe on the lid side. In this case, upon closing of the lid, the primary and secondary pipes are automatically and hermetically connected to each other.

The heat treatment apparatus of the present invention preferably includes means, located adjacent to the shield gas supply means, for directing the shield gas toward the magnetic fluid seal member. The pressure of the enclosing space is always higher than that of the reaction space by, e.g., about 5 to 10 Torr. The enclosing space can communicate with the reaction space through a narrow path. In this case, the shield gas is exhausted together with the reaction gas through a common flow path.

The shield gas preferably consists of one gas selected from among treatment gases, such as hydrogen, which do not adversely affect the seal member, or preferably consists of an inert gas such as nitrogen or argon.

A treatment method according to the present invention for supplying a treatment gas into a treatment space to treat an object comprises a process for loading the object into the treatment space, a process for supplying a treatment gas into the treatment space, a process for sustaining a noncorrosive shield gas atmosphere covering a portion contained in the treatment space which is susceptible to corrosion by a treatment gas within the treatment space.

The above and other objects, the features, and the advantages of the present invention will be apparent from the following detailed description in conjunction with the accompanying drawings.

BRIEF DESCRIPTION OF THE DRAWINGS

FIG. 1 is an enlarged view showing a main part of a heat treatment apparatus for gas-phase epitaxial growth according to an embodiment of a treatment apparatus according to the present invention;

FIG. 2 is a longitudinal sectional front view showing the overall structure of the apparatus shown in FIG. 1.

DETAILED DESCRIPTION OF THE PREFERRED EMBODIMENT

Figure 3:
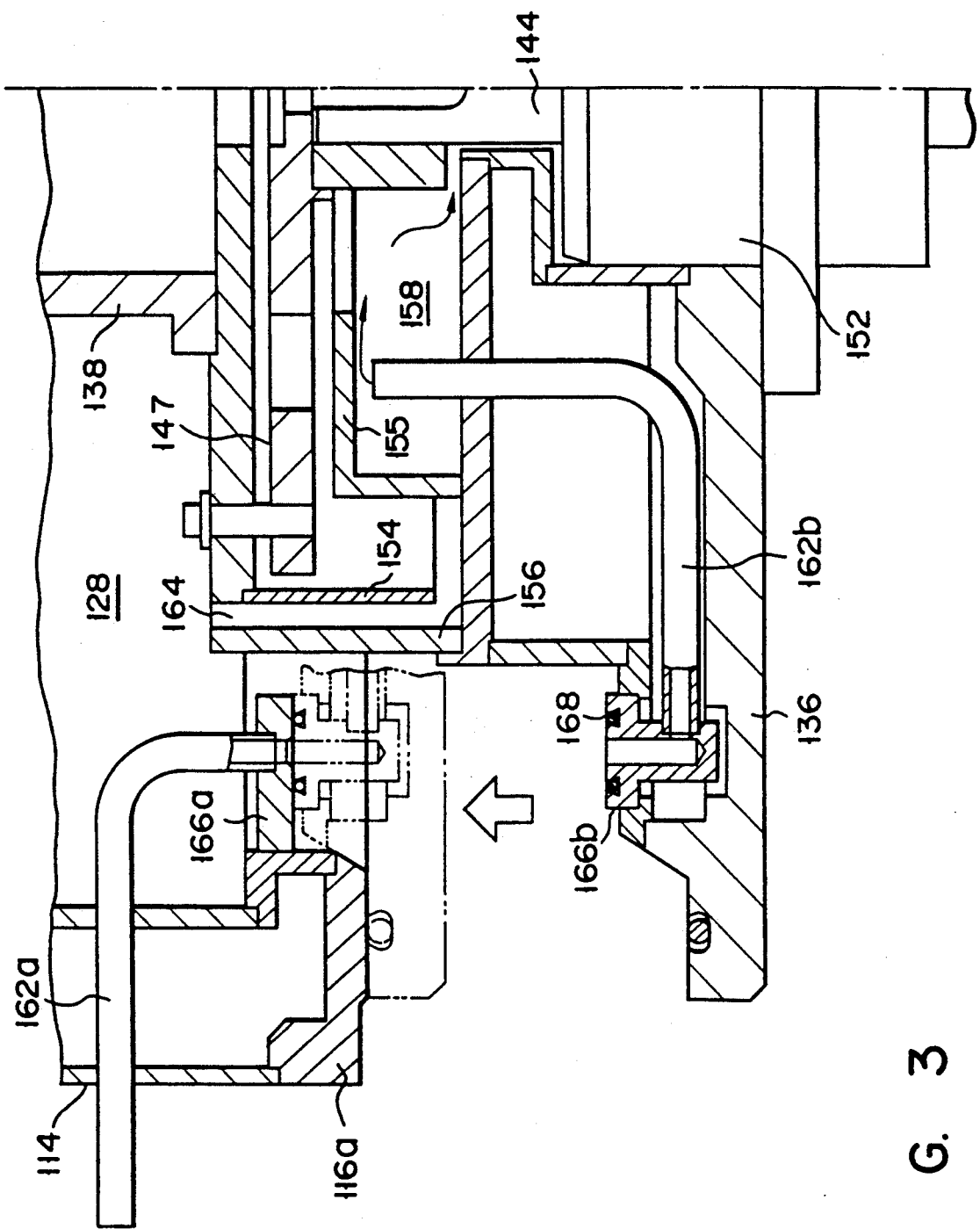
FIG. 3 is an enlarged view showing part of a second embodiment of the present invention.

As shown in FIG. 2, a heat treatment apparatus for a gas-phase epitaxial growth according to the present invention comprises a treatment portion 12 and a loading portion 72. A double-structured reaction tube 14 having a vertical axis is arranged in the treatment portion 12. A boat 24 for supporting a large number of objects to be treated, e.g., semiconductor wafers 22 is stored in the reaction tube 14. A lift mechanism 74 is arranged in the loading portion 72. The lift mechanism 74 loads the boat 24 from a predetermined lower position to the reaction tube 14 or unloads the boat 24 from the reaction tube 14 to the predetermined lower position.

The reaction tube 14 consists of outer and inner tubes 16 and 18 which consist of a heat-resistive material (e.g., quartz) which does not easily react with the reaction gas. The upper ends of the outer and inner tubes 16 and 18 are capped, and the tubes 16 and 18 are cylindrical. The inner tube 18 is located inside the outer tube 16 in a noncontact manner. A cylindrical heating mechanism 26 coaxially surrounds the reaction tube 14. The heating mechanism 26 comprises, e.g., a coil-like resistive heater. The heater is connected to an AC power source (not shown) to uniformly heat the area of the wafers 22 at a temperature of, e.g., 800° C. to 1,050° C.

A gas supply pipe 32 is located inside the inner tube 18 of the reaction tube 14 to supply a predetermined reaction gas to the interior of the inner tube 18. The gas supply pipe 32 is connected to a gas source (not shown) through a mass flow controller or the like. The gas supply pipe 32 extends vertically up to the upper surface of the inner tube 18 along its inner wall. A large number of holes (not shown) are formed in the wall of the inner tube 18 at predetermined intervals along the longitudinal direction. Holes (not shown) for exhausting the reaction gas are formed in the inner tube 18. These holes respectively correspond to those of the gas supply pipe 32. By a combination of the holes of the gas supply pipe 32 and the holes of the inner tube 18, a horizontal reaction gas flow parallel to the surface of each substrate to be treated can be formed in a state wherein a large number of wafers 22 are set in the inner tube 18.

One end of an exhaust pipe 34 is connected to the outer tube 16 of the reaction tube 14. The other end of the exhaust pipe 34 is connected to a vacuum pump (not shown) for reducing an internal pressure of the reaction tube to a desired pressure and for exhausting the reaction gas and the like. When the reaction gas is supplied to the reaction tube 14, the reaction gas horizontally flows in a direction parallel to the surface of each wafer 22 inside the inner tube 18. At this time, the substrates are treated. The reaction gas is exhausted from the large number of holes of the inner tube 18 to the outer tube 16, flows downward in the outer tube 16, and is exhausted outside the reaction tube 14.

A lid 36 is detachably mounted to set the reaction tube 14 as a hermetic treatment chamber. The boat 24 for supporting the wafers 22 thereon is supported above the lid 36. The boat 24 can be placed at a predetermined level within the reaction tube 14. A heat-retaining cylinder 38 is provided between the boat 24 and the lid 36 to prevent heat dissipation of the reaction tube 14. The boat 24 consists of a heat-resistive material (e.g., quartz) which is inert to the reaction gas. A large number (e.g., 25) of substrates, several uppermost dummy substrates, and several lowermost dummy substrates can be stacked on the boat 24 at predetermined intervals in the vertical direction.

A boat rotary mechanism is arranged on the lid 36. The wafers 22 on the boat can be rotated about the vertical axis of the reaction tube 14 at the time of a treatment. Rotation of the wafers 22 contributes to uniform formation of an epitaxial layer on the substrate. A drive motor 42 as shown in FIG. 1, is arranged in the rotary mechanism and is in contact with the lower surface of the lid 36. A rotating shaft 44 extending through the center of the lid 36 and further extending vertically into the reaction tube 14 is connected to the motor 42. The rotating shaft 44 extends through the lid 36, and the distal end of the rotating shaft 44 is fixed to a support 46 for supporting the boat 24 and the heat-retaining cylinder 38. A journal bearing 48 is arranged at a portion of the lid 36 through which the rotating shaft 44 extends.

A seal member 52 is provided inside the lid 36, adjacent to the journal bearing 48, to maintain the hermetic state of the reaction space. The seal member 52 consists of a known magnetic fluid obtained by mixing magnetic fine particles in a fluid medium at a high concentration. The position of the magnetic fluid is maintained by the rotating shaft 44 as a magnetic member and a permanent magnet (not shown) arranged on the lid 36.

A ring-like inner barrier 54 extends from the peripheral portion of the support 46 toward the lid 36. A ring-like outer barrier 56 extends from the inner surface of the lid to surround the inner barrier. These barriers form a space 58 which almost encloses the seal member 52 from a reaction space 28 between the support 46 and the lid 36. One end of a gas supply nozzle 62 extending through the lid 36 is located in the space 58. The other end of the nozzle 62 is connected to a noncorrosive shield gas source such as a hydrogen ($H_2$) gas source.

During the treatment, a small amount of shield gas is continuously supplied from the nozzle 62 to the enclosing space 58. A gas supply amount is set such that the pressure of the enclosing space 58 is always higher than that of the reaction space 28 by about 5 to 10 Torr. When a pressure of the reaction space 28 during the treatment is, e.g., 1 to 10 Torr, the pressure of the enclosing space 58 is 6 to 20 Torr. In a practical operation, a supply amount of shield gas is determined by a gap 64 between the inner barrier 54 and the outer barrier 56, i.e., dimensions of the gas flow path which connect the enclosing space 58 and the reaction space 28. The enclosing space 58 is held in a positive pressure, and it is difficult to cause the reaction gas to flow in the enclosing space 58. Therefore, the magnetic fluid is protected from a gas such as hydrogen chloride (HCl) generated by the reaction gas and a reaction between the reaction gases.

The shield gas supplied to the enclosing space 58 is supplied to the reaction tube 14 through the gap 64 between the inner and outer barriers 54 and 56 and is exhausted from the exhaust pipe 34 through the same path as that of the reaction gas. Therefore, the shield gas neither adversely affects the magnetic fluid nor the treatment reaction which is the primary objective of the treatment apparatus of the present invention. According to this embodiment, hydrogen is selected from among the reaction gases as a shield gas. Other gases suitable for this purpose are inert gases such as nitrogen ($N_2$) and argon (Ar).

As shown in FIG. 2, the lid 36 is supported by the lift mechanism 74 including a ball screw and a motor. The boat 24 arranged above the lid 36 is moved vertically by the lift mechanism 74; i.e. the boat 24 is moved between the treatment portion 12 and the loading portion 72 arranged below the treatment portion 12. In the loading portion 72, the boat 24, supporting a large number of substrates, is mounted on or removed from the heat-retaining cylinder by a convey unit (not shown).

The operations and condition setting of the heat treatment apparatus described above are controlled by a control unit (not shown).

A method of forming a silicon (Si) thin film on a silicon semiconductor wafer substrate by the above apparatus will now be described.

The boat 24 having a large number of wafers thereon is conveyed to the loading portion 72 by a boat conveyor unit (not shown) and is placed on the heat-retaining cylinder 38. The boat 24 is moved upward a predetermined amount by the lift mechanism 74 and is placed at a predetermined position inside the reaction tube 14, without coming into contact with the inner wall surface thereof. At this time, the lower end portion of the reaction tube 14 is brought into contact with the lid 36, and the boat 24 is automatically positioned, and at the same time, a hermetic reaction space is formed. A vacuum pump (not shown) connected to the reaction tube 14 is operated and controlled to maintain the reaction space at a predetermined low pressure, e.g., 1 to 10 Torr. Simultaneous with the evacuation operation, a voltage is applied to the heater 26, and the heater heats the reaction space to a desired temperature, e.g., from 800° to 1,050° C.

When the desired conditions are set, the flow rate of the reaction gas is determined by a mass flowmeter, and the reaction gas is then supplied into the reaction space within a predetermined period of time. The motor 42 of the rotary mechanism is driven, and the rotating shaft and the support which are connected to the motor are rotated at a speed of, e.g., 20 rpm, causing the heat-retaining cylinder 38 on the support 46 and the boat 24, which supports the substrates, to be rotated. As a result, silicon (Si) single-crystal thin films having the same crystal axes as those of the substrates are formed of the surfaces of the substrates placed within the reaction space.

When the reaction gas is supplied to the reaction space, a gas such as hydrogen is supplied through the shield gas supply nozzle 62 to the space enclosing the magnetic fluid seal member 52. The amount of shield gas supplied is set such that the pressure within the enclosing space 58 is higher than that within the reaction space 28. Since the hydrogen gas always flows from the enclosing space 58 to the reaction space 28 through the gap 64 between the barriers, the reaction gas and a gas produced during the treatment do not flow toward the position of the magnetic fluid seal member 52 and thus do not adversely affect the magnetic fluid contained therein. The reaction gas and the shield gas flow in the outer tube 16 through a large number of holes formed in the inner tube 18 and are exhausted from the exhaust pipe 4 connected to the outer tube.

Supply of the shield gas prevents the generation of gases which normally occur as a result of an undesirable chemical reaction between the corrosive gas and the magnetic fluid constituting the seal member 52, as well as preventing corrosion of the seal member 52 and hence the peripheral components such as the journal bearing 48. Therefore, a decrease in production yield, caused by an adverse influence of the wafer treatment reaction and shortening of the operating time of the apparatus by frequent maintenance operations can be prevented.

After the treatment, supply of the reaction gas is stopped, and the reaction space is filled with an inert gas such as nitrogen, and the internal pressure is increased to atmospheric pressure. The boat 24 which supports the large number of wafers 22 is moved downward toward the loading portion 72 by the lift mechanism 74, thereby completing the treatment.

In order to provide greater protection for the magnetic fluid, the supply of the shield gas is started before the supply of the reaction gas commences, and the supply of the reaction gas is stopped automatically when the supply of the shield gas is stopped.

FIG. 3 is an enlarged view showing part of a second embodiment of the present invention. Reference numeral 116a in FIG. 3 denotes a lower end manifold of a reaction tube; and 136, a lid for closing a lower end opening of the reaction tube 114. A lift mechanism (not shown) as in the first embodiment is arranged below the lid 136, and the lid 136 opens or closes the reaction tube by the lift mechanism. A heat-retaining cylinder 138 is provided above the lid 136, and a wafer boat (not shown) for supporting a wafer substrate as an object is placed on the heat-retaining cylinder 138.

A rotating shaft 144 connected to a motor of a lower rotating mechanism (not shown) extends through substantially the center of the lid 136. The upper end of the rotating shaft 144 is connected to a turntable 147 stationary to the wafer boat. A magnetic fluid seal member 152 fixed to the lid 136 is provided at a portion of the lid 136 through which the rotating shaft 144 extends, thereby hermetically sealing the opening portion.

A primary pipe 162a for a shield gas supply nozzle extends through the side wall of the manifold 116a is located in the manifold 116a at the lower end portion of the reaction tube 114. One end of the pipe 162a is connected to a noncorrosive shield gas source (not shown) such as a hydrogen ($H_2$) source outside the reaction tube. The other end of the pipe 162a is connected to a flange 166a incorporated in the manifold.

A secondary pipe 162b for the shield gas supply nozzle is mounted in the lid 136. One end of the pipe 162b is connected to a flange 166b paired with the flange 116a. The other end of the pipe 162b is open to an enclosing space 158 for the seal member. The flanges 116a and 116b are matched with each other when the lid is in contact with the manifold to close the reaction tube. In this state, the primary and secondary pipes 162a and 162b are connected to each other. An O-ring 168 is embedded in an abutment surface of the flange 116b to hermetically seal the pipe connecting portions.

The enclosing space 158 is formed by a ring-like inner barrier 154 extending from the heat-retaining cylinder side and a ring-like outer barrier 156 extending from the lid side to surround the inner barrier. A gap 164 is formed between the inner and outer barriers 154 and 156. The enclosing space 156 communicates with the reaction space 128 through the gap 164. An interference plate 155 is disposed to oppose a spray port of the pipe 162b to direct the shield gas toward the rotating shaft 144. The shield gas supplied to the enclosing space 158 is directed by the interference plate 155 and flows along the rotating shaft. The shield gas passes through the gap 164 and flows in the reaction space 128. The shield gas is then exhausted along the same path as that of the reaction gas.

In the second embodiment, the pressure of the enclosing space 158 is set higher than that of the reaction space 128 upon supply of the shield gas to prevent the seal member and the like from corrosion. The operation of the heat treatment apparatus is almost identical with that of the first embodiment, and a detailed description thereof will be omitted. The second embodiment has the following two advantages which cannot be obtained by the first embodiment. According to the first advantage, the shield gas supply pipes 162a and 162b are automatically connected to each other when the lid closes the reaction tube during wafer loading. In the first embodiment, the nozzle 62 and the gas source pipe are generally connected after the lid is closed, thus resulting in a cumbersome operation requiring one additional procedure. According to the second advantage, since the flow path of the shield gas is limited by the interference plate 155, the shield gas can be effectively used. In addition, the spray speed of the shield gas from the gap 164 can be controlled, so that particles located on a reaction pipe wall or the like tend not to be scattered.

The details of the present invention have been exemplified with reference to the preferred embodiments taken in conjunction with the accompanying drawings. However, the present invention is not limited to these embodiments, and various changes and modifications may be made without departing from the scope of the invention. It should be noted that the present invention is not limited to the seal portion of a journal bearing but is applicable to various corrodible portions in the atmosphere of a treatment space. The present invention is applicable to thermal treatment apparatuses such as diffusion, oxidation, and annealing apparatuses as well as treatment apparatuses such as sputtering, etching, ashing, and ion implantation apparatuses in addition to the treatment apparatus for gas-phase epitaxial growth. The rotary mechanism is exemplified by a mechanism wherein the motor is directly connected to the rotating shaft. However, a driving force of the motor may be transmitted to a rotating shaft through a pulley and a timing belt. The seal member for the journal bearing is not limited to the magnetic fluid but can be replaced with other means such as an O-ring and a bellows. The shield supply nozzle may be a ring-like nozzle which surrounds the rotating shaft and may supply the shield gas from a plurality of holes formed in the entire circumferential surface of the ring to the rotating shaft. A shield gas exhaust duct may be connected to the enclosing space. An object to be treated is not limited to a semiconductor wafer but can be a liquid crystal display substrate (LCD) used for a TV screen or the like.

We claim:

1. A treatment apparatus for supplying a treatment gas into a treatment space to treat an object, comprising:
   means for defining said treatment space;
   a corrodible portion forming part of the treatment apparatus and contained therein, and susceptible to corrosion in an atmosphere within the treatment space;
   means for defining an enclosing space by enclosing the corrodible portion contained in the treatment space; and
   means for supplying a noncorrosive shield gas into the enclosing space, wherein:
   said enclosing space is held in a positive pressure higher than that of said treatment space by supplying the shield gas during the treatment,
   said treatment space defining means is comprised of a reaction tube and a lid for opening/closing the reaction tube, and said corrodible portion is located on the lid, and
   a gas pipe for said shield gas supplying means is divided into a primary pipe located on said reaction tube, and a secondary pipe on said lid, and said primary and secondary pipes are automatically connected to each other in an air-tight state by closing said lid.

2. An apparatus according to claim 1, wherein the enclosing space and the treatment space communicate with each other via a narrow path.

3. An apparatus according to claim 2, further including means, located adjacent to said shield gas supply means, for directing the shield gas toward the corrodible portion.

4. An apparatus according to claim 1, wherein the corrodible portion comprises a magnetic seal member for supporting a rotating shaft extending through said lid.

5. An apparatus according to claim 1 wherein the shield gas is one selected from inert gases.

6. An apparatus according to claim 1 wherein the shield gas is one selected from inert gases.

7. An apparatus according to claim 1, wherein the pressure in the enclosing space is always higher by about 5 to 10 Torr than that in the treatment space.

* * * * *